(12) United States Patent
Lee

(10) Patent No.: US 9,178,150 B2
(45) Date of Patent: Nov. 3, 2015

(54) RESISTIVE MEMORY DEVICE, METHOD OF FABRICATING THE SAME, AND MEMORY APPARATUS AND DATA PROCESSING SYSTEM HAVING THE SAME

(71) Applicant: SK hynix Inc., Gyeonggi-do (KR)

(72) Inventor: Sung Min Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/566,544

(22) Filed: Dec. 10, 2014

(65) Prior Publication Data

US 2015/0140775 A1 May 21, 2015

Related U.S. Application Data

(62) Division of application No. 13/719,733, filed on Dec. 19, 2012, now Pat. No. 8,941,090.

(30) Foreign Application Priority Data

Aug. 24, 2012 (KR) .......................... 10-2012-0093198

(51) Int. Cl.
*H01L 21/20* (2006.01)
*H01L 45/00* (2006.01)
*H01L 27/24* (2006.01)

(52) U.S. Cl.
CPC ............ *H01L 45/16* (2013.01); *H01L 45/1253* (2013.01); *H01L 27/2409* (2013.01); *H01L 27/2463* (2013.01); *H01L 45/06* (2013.01); *H01L 45/144* (2013.01); *H01L 45/1641* (2013.01)

(58) Field of Classification Search
CPC ....... H01L 45/144; H01L 45/16; H01L 45/06; H01L 45/1233; H01L 45/1641; H01L 27/2463; H01L 27/2409; H01L 45/148; H01L 45/165; H01L 45/126
USPC .......... 438/382, 381, 618, 259, 102; 257/2, 4, 257/E21.033
See application file for complete search history.

(56) References Cited

U.S. PATENT DOCUMENTS

| | | | |
|---|---|---|---|
| 7,944,764 B1 | 5/2011 | Qawami et al. | |
| 2009/0237983 A1* | 9/2009 | Happ et al. | 365/163 |
| 2010/0197076 A1* | 8/2010 | Ha et al. | 438/102 |
| 2012/0007032 A1 | 1/2012 | Lee et al. | |
| 2013/0017663 A1 | 1/2013 | Park et al. | |

OTHER PUBLICATIONS

Office Action issued by the USPTO for another divisional U.S. Appl. No. 14/566,555 of the parent U.S. Appl. No. 13/719,733 on Feb. 25, 2015.

* cited by examiner

*Primary Examiner* — Thinh T Nguyen
(74) *Attorney, Agent, or Firm* — IP & T Group LLP

(57) ABSTRACT

A resistive memory device capable of implementing a multi-level cell, a method of fabricating the same, and a memory apparatus and data processing system including the same are provided. The resistive memory device includes a lower electrode, a first phase-change material layer formed over the lower electrode, a second phase-change material layer formed to surround an outer sidewall of the first phase-change material layer, and an upper electrode formed over the first phase-change material layer and the second phase-change material layer.

6 Claims, 7 Drawing Sheets

RESISTIVE MEMORY DEVICE, METHOD OF FABRICATING THE SAME, AND MEMORY APPARATUS AND DATA PROCESSING SYSTEM HAVING THE SAME

CROSS-REFERENCES TO RELATED APPLICATION

This application is a division of U.S. patent application Ser. No. 13/719,733 filed on Dec. 19, 2012, which claims priority under 35 U.S.C. 119(a) to Korean application number 10-2012-0093198, filed on Aug. 24, 2012, in the Korean Patent Office. The disclosure of each of the foregoing application is incorporated by reference in its entirety.

BACKGROUND OF THE INVENTION

1. Technical Field

The embodiments of the present invention relate to a semiconductor integrated device, and more particularly, to a resistive memory device, a method of fabricating the same, and a memory apparatus and a data processing system having the same.

2. Related Art

Dynamic Random Access Memories (DRAMs) operate at high speed, but the DRAMs are volatile. Flash memories are highly integrated and nonvolatile, but the flash memories may not guarantee operation speed equivalent to DRAM operation speed.

Studies on memory devices having advantages of the DRAMs and flash memories have been actively progressed, and resistive memory devices that are nonvolatile and operate at a high speed have been suggested.

The resistive memory devices are a memory device using a variable resistive material, which switches at least two resistance states by rapid resistance change based on an applied voltage. There are phase-change RAMs (PCRAMs) and resistive RAMS (ReRAMs) memory devices as the resistive memory devices.

The PCRAMs store data by changing a crystalline state of the variable resistive material with current applied to a heating electrode. The PCRAMs have advantages of a nonvolatile property, high operation speed, stability, unnecessity of an erase operation, endurance, and support for access in units of bytes.

The PCRAMs have to be designed to support a multi-level cell (MLC) structure to obtain large capacity and high integration. The PCRAMs having the MLC structure, which have been studied until recently, are implanted using a method of controlling a pulse applied to memory cells having the same structure as a single-level cell (SLC).

That is, the current PCRAMs have to accurately control a pulse type applied to implement the MLC, and this is because a set/reset state of data becomes transited depending on crystallization of a phase-change material. When the property of the phase-change material is changed by repetitive use of the PCRAMs, undesired data is written, and thus, there are limitations to implement MLC through the same structure as SLC.

SUMMARY

In accordance with an embodiment of the present invention, the resistive memory device may include a lower electrode, a first phase-change material layer formed over the lower electrode, a second phase-change material layer formed to surround an outer sidewall of the first phase-change material layer, and an upper electrode formed over the first phase-change material layer and the second phase-change material layer.

In accordance with another embodiment of the present invention, the method of manufacturing a PCRAM device may include providing a semiconductor substrate in which a lower electrode is formed, sequentially forming a first phase-change material layer, an electrode layer, and a hard mask over the semiconductor substrate in which the lower electrode is formed, patterning the hard mask, the electrode layer, and the first phase-change material layer so that the first phase-change material layer is in contact with the lower electrode, and doping and curing a preset combination element into the first phase-change material layer to change an outer circumference of the first phase-change material layer to a second phase-change material layer having a predetermined thickness.

In accordance with another embodiment of the present invention, the resistive memory apparatus may include a memory cell array including a plurality of memory cells connected between word lines and bit lines, and a controller configured to control data write and data read for a selected memory cell in the memory cell array. Each of the plurality of memory cells may include a resistive device and a selection device. The resistive device may include a lower electrode, a first phase-change material layer formed over the lower electrode, a second phase-change material layer formed to surround an outer sidewall of the first phase-change material layer, and an upper electrode formed over the first phase-change material layer and the second phase-change material layer.

In accordance with another embodiment of the present invention, the data processing system may include a resistive memory apparatus, which includes a memory cell array including a plurality of memory cells connected to bit lines and word lines, each of memory cells including a resistive device and a selection device, and a controller configured to control an operation of the memory cell array, and a memory controller configured to access the resistive memory apparatus in response to request of a host. The resistive device may include a lower electrode, a first phase-change material layer formed over the lower electrode, a second phase-change material layer formed to surround an outer sidewall of the first phase-change material layer, and an upper electrode formed over the first phase-change material layer and the second phase-change material layer.

In accordance with another embodiment of the present invention, the data processing system may include a processor, an operation memory configured to store an application, data, and a control signal required for an operation of the processor, a resistive memory apparatus that includes a memory cell array including a plurality of memory cells connected to bit lines and word lines, each of memory cells including a resistive device and a selection device, and a user interface configured to perform data input/output (I/O) between the processor and a user. The resistive device may include a lower electrode, a first phase-change material layer formed on the lower electrode, a second phase-change material layer formed to surround an outer sidewall of the first phase-change material layer, and an upper electrode formed over the first phase-change material layer and the second phase-change material layer.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
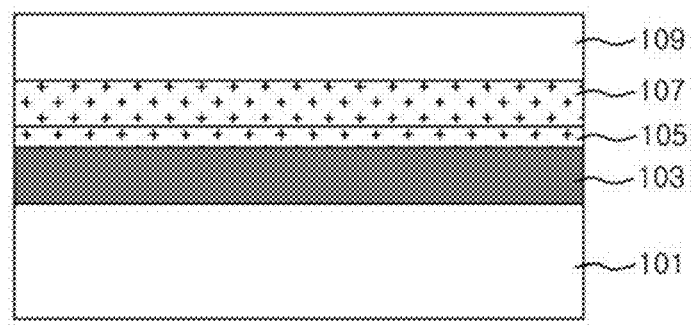
FIGS. 1 to 4B are views illustrating a method of fabricating a resistive memory device according to an exemplary embodiment of the inventive concept.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations n shapes that result, for example, from manufacturing. In the drawings, lengths and sizes of layers and regions may be exaggerated for clarity. Like reference numerals in the drawings denote like elements. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

FIGS. 1 to 4B are views illustrating a method of fabricating a resistive memory device according to an exemplary embodiment of the inventive concept.

First, a first phase-change material layer 103, electrode layers 105 and 107, and a hard mask 109 are sequentially formed on a semiconductor substrate 101 in which a bottom structure is formed.

An access device and a lower electrode may be formed in the semiconductor substrate 101, and a word line may be further formed on the semiconductor substrate 101. The bottom structure may be designed using various types and methods and is beyond the scope of the inventive concept, and thus, detailed description thereof will be omitted.

The electrode layers 105 and 107 may have a stacked structure of a titanium layer 105 and a titanium nitride layer 107, but the electrode layers are not limited to the stacked structure.

The first phase-change material layer 103 may be selected from a material in which a crystalline state is changed based on the applied current. For example, the first phase-change material layer 103 may be formed using a binary chalcogenide compound, for example, germanium (Ge)-tellurium (Te).

Figure 2A:
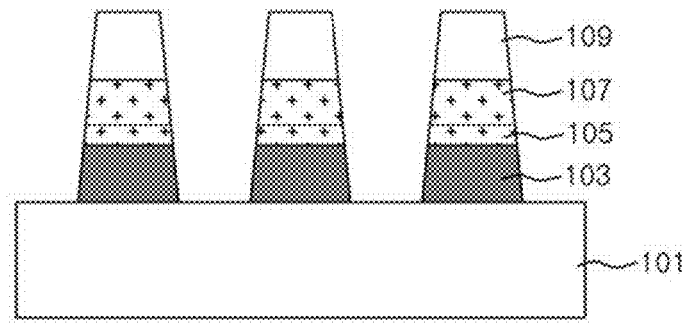

Referring to FIG. 2A, the hard mask 109 is patterned using a photoresist film (not shown) and then, the electrode layers 107 and 105 and the first phase-change material layer 103 are patterned using the patterned hard mask as an etch mask. At this time, the patterned structure may be formed to have a cylindrical shape of cross-section, but the patterned structure is not limited thereto.

Through the patterning process, a top of the first phase-change material layer 103 is shielded by the electrode layers 105 and 107 and the hard mask 109, a bottom thereof is shielded by the semiconductor substrate 101, and thus only sides thereof are exposed.

Figure 2B:
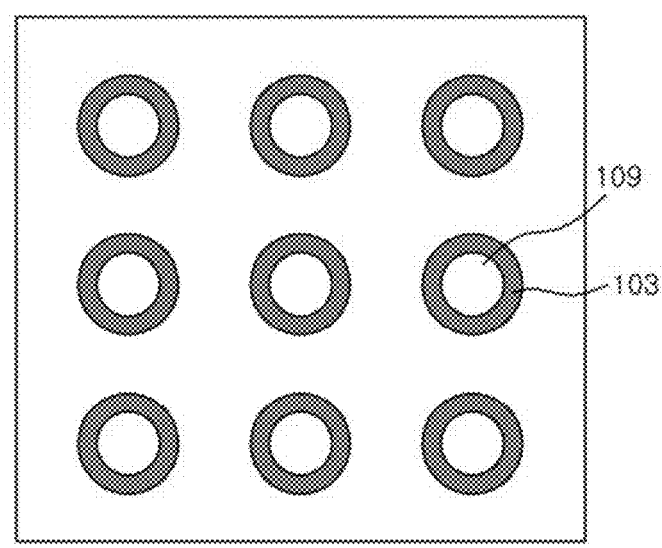

FIG. 2B illustrates a layout diagram after the process of FIG. 2A is completed.

Figure 3:
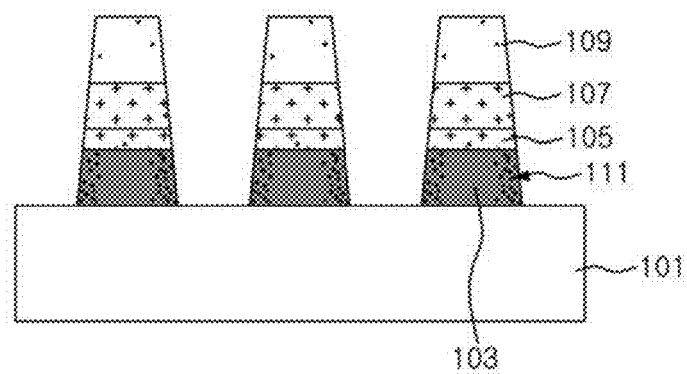

Referring to FIG. 3, a preset combination element 111 is doped into the semiconductor substrate 101 in which the patterned structure is formed. The combination element 111 may be selected from a material, which is chemically combined with a component of the first phase-change material layer 103, to represent resistance change characteristic. If the first phase-change material layer 103 includes, for example, Ge—Te, the material that is chemically combined with Ge—Te to represent the resistance change characteristic may be antimony (Sb).

In FIG. 3, the combination element 111 to be combined with the first phase-change material layer 130 may be doped using a plasma doping (PLAD) method and controlled to be isotropically doped. At this time, materials (the hard mask 109 and the electrode layers 105 and 107) other than the exposed surface of the first phase-change material layer 103 are amorphous, and thus, the combination element 111 is not well doped into the amorphous material. Therefore, the selective doping only into the sidewall of the first phase-change material layer 103 is possible.

The doping energy is controlled so that the combination element 111 is doped only into the sidewall of the first phase-change material layer 103 and therefore, a phase-change material pattern is to be formed in a core-shell structure in a subsequent process.

A cleaning process for removing the combination element 111 doped in an undesired portion is performed and then a low temperature curing process for stabilizing the combination element 111 is performed. Therefore, as shown in FIG. 4A, a second phase-change material layer 113 is formed to surround the sidewall of the first phase-change material layer 103.

Figure 4A:
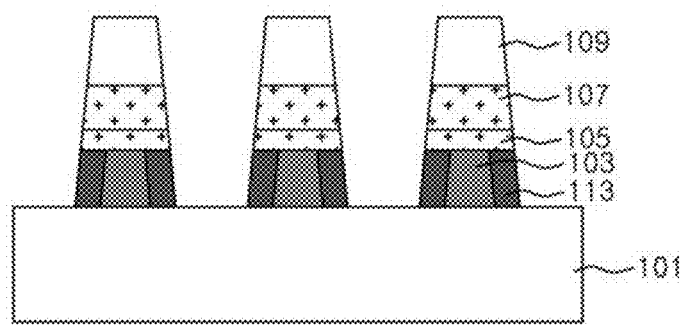
Figure 4B:
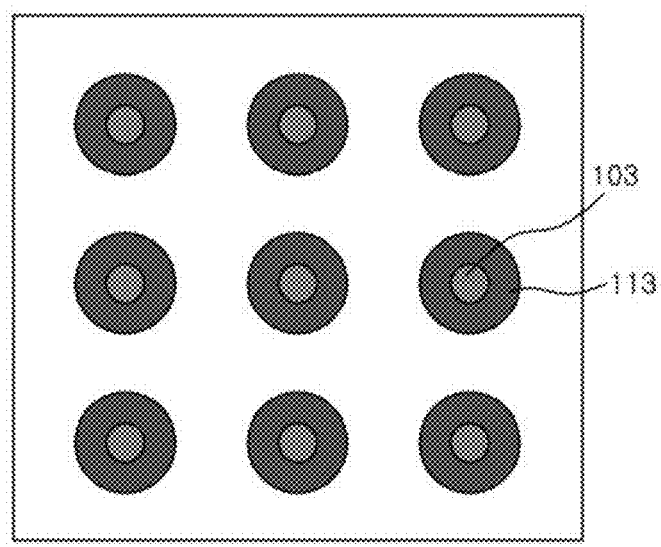

FIG. 4B illustrates a plan view of the resistive memory device illustrated in FIG. 4A, wherein FIG. 4B illustrates a plan view illustrating a portion in which the first and second phase-change material layers 103 and 113 are formed.

As shown in FIG. 4B, the first phase-change material layer 103 is formed in a center position, that is, in a core. The first phase-change material layer 103 is in contact with the lower electrode (not shown), and thus is changed in the crystallization state by the heat applied through the lower electrode. The second phase-change material layer 113 may be formed in a shell surrounding an outer circumference of the center position.

On the other hand, a thickness of the second phase-change material layer 113 may be determined based on a process parameter in the curing process and composition of the second phase-change material layer 113 may be also determined. The thickness and composition of the first and second phase-change material layers 103 and 113 may be parameters for implementing the MLC, and therefore, the MLC may be fabricated through only simple change of the process parameter for determining a curing condition in the inventive concept.

In the resistive memory device as formed, the first phase-change material layer 103 formed in the core and the second phase-change material layer 113 formed in the shell have electric properties from each other.

If the first phase-change material layer 103 is formed of Ge—Te, the second phase-change material layer 113 may include germanium (Ge)-antimony (Sb)-tellurium (Te) (GST) using Sb as the combination element 111. Ge—Te has a high melting point and low crystallization speed compared to GST. Therefore, the MLC may be implemented using the electric property difference.

Figure 5:
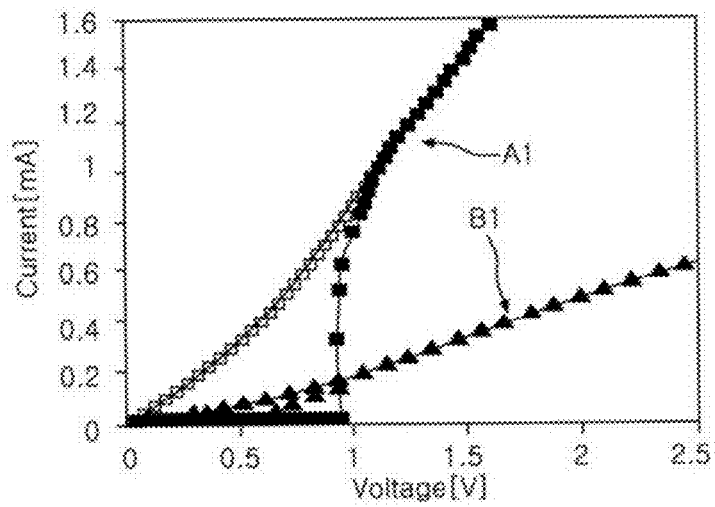
FIGS. 5 and 6 are line graphs illustrating operation characteristic of a variable resistive material applied to the inventive concept.
Figure 6:
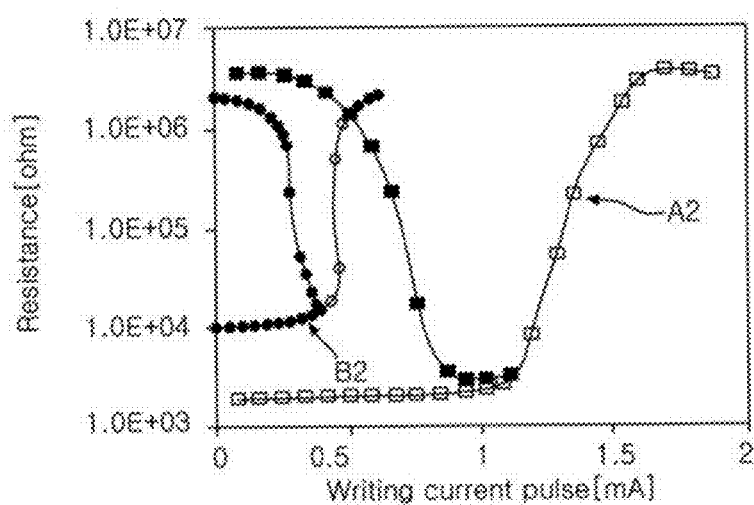

FIGS. 5 and 6 are views illustrating operation characteristic of a variable resistive material applied to the inventive concept.

First, FIG. 5 illustrates voltage-current characteristic of the GST material and the Ge—Te material. It can be seen from FIG. 5 that the GST material A1 has lower resistance compared to the Ge—Te material B1.

FIG. 6 is a graph illustrating resistance change when a write current is applied to the GST material A2 and the Ge—Te material B2. In can be seen from FIG. 6 that the resistance change in the Ge—Te material B2 easily occurs even in the low write current while the GST material A2 needs higher write current than the Ge—Te material B2.

Actually, the Ge—Te material has a melting point of 725° C. in a bulk state and the GST material has a low melting point of 616° C. As shown in FIGS. 5 and 6, the crystallization state in the Ge—Te material is changed in lower current than the GST material according to the melting property. Therefore, the melting property is applied to the ReRAM to enable the MLC to be implemented.

The phase-change material layer may include a GST single layer in the general phase-change memory device. Therefore, only two states of the crystallization state and the amorphous state in the GST material are used as a data storage property. Thus, precise current control is necessary to implement MLC in the general PCRAM including the GST single layer.

However, in the PCRAM of the exemplary embodiment, the phase-change material layer is formed in the core-shell structure and in particular, the phase-change material layer in the core includes a material having a melting point higher than the phase-change material layer in the shell. A heating electrode may be in contact only with the phase-change material layer in the core, and thus, resistance state of the phase-change material layer in the shell is changed by the heat conducted from the phase-change material layer in the core.

That is, the phase-change material layer is formed by the core-shell dual structure having different electric properties from each other to easily control the resistance state, and thus, MLC may be implemented.

Figure 7:
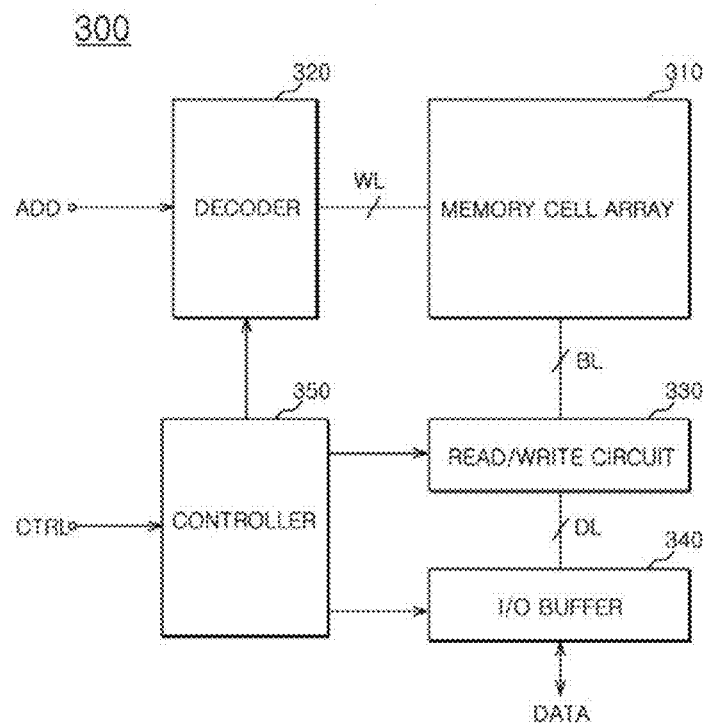
FIG. 7 is a block diagram illustrating a configuration of a memory apparatus according to an exemplary embodiment of the inventive concept.

FIG. 7 is a view illustrating a configuration of a memory apparatus according to an exemplary embodiment of the inventive concept.

Referring to FIG. 7, a memory apparatus 300 according to the exemplary embodiment of the inventive concept includes a memory cell array 310, a decoder 320, a read/write circuit 330, an input/output (I/O) buffer 340, and a controller 350.

Each of a plurality of memory cells included in the memory cell array 310 may be configured to include the resistive memory device illustrated in FIG. 4A. Furthermore, the plurality of memory cells in the memory cell array 310 are connected to the decoder 320 through a word line WL. The plurality of memory cells in the memory cell array 310 are also connected to the read/write circuit 330 through a bit line BL.

The decoder 320 receives an external address ADD and decodes a row address and a column address to be accessed in the memory cell array 310 by control of the controller 350, which operates according to a control signal CTRL.

The read/write circuit 330 receives data DATA from the I/O buffer 340 and writes data in a selected memory cell of the memory cell array 310 under the control of the controller 350 or provides data read from a selected memory cell of the memory cell array 310 to the I/O buffer 340 under the control of the controller 350.

Figure 8:
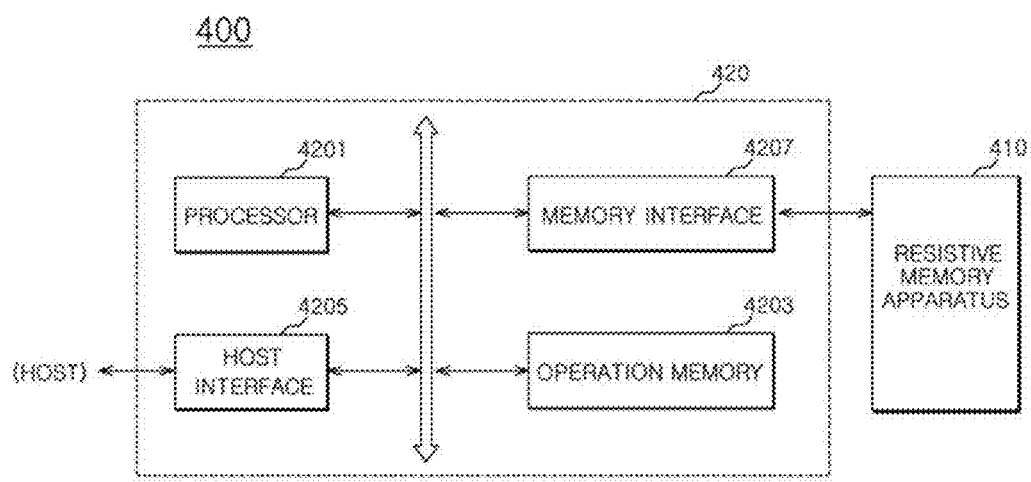
FIG. 8 is a block diagram illustrating a configuration of a data processing system according to an exemplary embodiment of the inventive concept.

FIG. 8 is a block diagram illustrating a configuration of a data processing system according to an exemplary embodiment of the inventive concept.

A data processing system 400 illustrated in FIG. 8 may include a memory controller 420 connected between a host and a resistive memory apparatus 410.

The memory controller 420 may be configured to access the resistive memory apparatus 410 in response to request of the host, and thus, the memory controller 420 may include a processor 4201, an operation memory 4203, the host interface 4205, and a memory interface 4207.

The processor 4201 may control an overall operation of the memory controller 420, and the operation memory 4203 may store an application, data, a control signal, and the like, required for operation of the memory controller 420.

The host interface 4205 performs protocol conversion for exchange of data/control signal between the host and the memory controller 420. The memory interface 4207 performs protocol conversion for exchange of data/control signal between the memory controller 420 and the resistive memory apparatus 410.

The resistive memory apparatus 410 may include a memory cell array configured of unit memory cells each including a resistive device, in which the variable resistive material is formed between two electrode layers, and a selection device. In particular, the resistive device may be a resistive device using a first phase-change material layer formed in a center position thereof and a second phase-change material layer formed to surround an outer circumference of the first phase-change material layer as a variable resistive material layer.

In the exemplary embodiment of the inventive concept, the data processing system illustrated in FIG. 8 may be a memory card, but the data processing system is not limited thereto.

Figure 9:
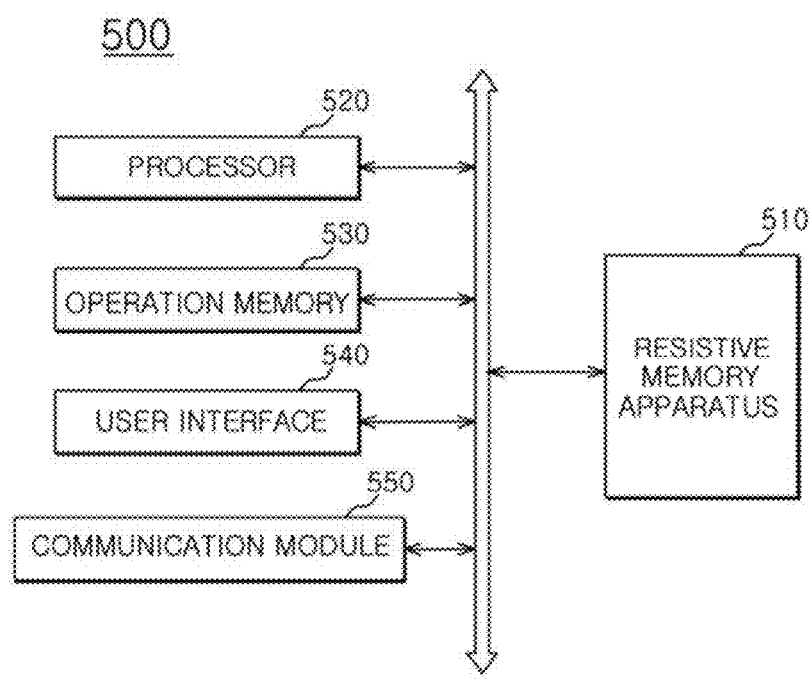
FIG. 9 is a block diagram illustrating a configuration of a data processing system according to another exemplary embodiment of the inventive concept.

FIG. 9 is a view illustrating a configuration of a data processing system according to another exemplary embodiment of the inventive concept.

A data processing system 500 illustrated in FIG. 9 includes a resistive memory apparatus 510, a processor 520, an operation memory 530, and a user interface 540. If necessary, the data processing system 500 may further include a communication module 550.

The processor 520 may be a central processing unit (CPU), and the operation memory 530 may store an application program, data, a control signal, and the like, required for an operation of the data processing system 500. The user interface 540 provides an environment accessible to the data processing system 500 by the user and provides a data processing procedure, result, and the like of the data processing system 500 to the user.

For example, the resistive memory apparatus 510 may include a memory cell array configured of unit memory cells each including a resistive memory device illustrated in FIG. 4A and a selection device. In particular, the phase-change material layer included in the resistive device may include a first phase-change material layer formed in a central portion thereof and a second phase-change material layer formed to surround an outer circumference of the first phase-change material layer.

On the other hand, the data processing systems illustrated in FIGS. 8 and 9 may be used as a disc apparatus, a built in/external memory card of a mobile electronic apparatus, an image processor, and other application chipsets.

The above embodiments of the present invention are illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method of fabricating a resistive memory device, the method comprising:
   providing a semiconductor substrate in which a lower electrode is formed;
   sequentially forming a first phase-change material layer, an electrode layer, and a hard mask over the semiconductor substrate in which the lower electrode is formed;
   patterning the hard mask, the electrode layer, and the first phase-change material layer so that the first phase-change material layer is in contact with the lower electrode; and
   doping and curing a preset combination element into the first phase-change material layer to change an outer circumference of the first phase-change material layer to a second phase-change material layer having a predetermined thickness.

2. The method of claim 1, wherein the first phase-change material layer is formed using a binary chalcogenide compound.

3. The method of claim 2, wherein the binary chalcogenide compound is a germanium-tellurium (Ge—Te) compound.

4. The method of claim 3, wherein the combination element is antimony (Sb).

5. The method of claim 1, wherein the combination element is doped by a plasma doping method.

6. The method of claim 1, wherein a thickness and composition of the second phase-change material layer are determined based on a curing process parameter.

* * * * *